United States Patent [19]

Jackson et al.

[11] Patent Number: 4,860,067
[45] Date of Patent: Aug. 22, 1989

[54] SEMICONDUCTOR HETEROSTRUCTURE ADAPTED FOR LOW TEMPERATURE OPERATION

[75] Inventors: Thomas N. Jackson, Peekskill; Alan W. Kleinsasser, Putnam Valley; Jerry M. P. Woodall, Bedford Hills, all of N.Y.

[73] Assignee: International Business Machines Corporation, Armonk, N.Y.

[21] Appl. No.: 137,033

[22] Filed: Dec. 23, 1987

Related U.S. Application Data

[63] Continuation of Ser. No. 876,552, Jun. 20, 1986, abandoned.

[51] Int. Cl.$^4$ .......................................... H01L 29/161
[52] U.S. Cl. .......................................... 357/16; 357/4; 357/5; 357/15; 357/22
[58] Field of Search ................ 357/4, 5, 15, 16, 22 A, 357/22 I, 22 K

[56] References Cited

U.S. PATENT DOCUMENTS

| | | | |
|---|---|---|---|
| 4,482,906 | 11/1984 | Hovel et al. | 357/16 |
| 4,583,105 | 4/1986 | Rosenberg | 357/23.12 |
| 4,590,502 | 5/1986 | Morkoc | 357/23.2 |

OTHER PUBLICATIONS

Ohno et al., "Double Heterostructure GaInAs MESFETS", IEEE Electron Device Letters, vol. EDL-1, No. 8 (Aug. 1980).
Fang et al., "Superconducting Field-Effect Transistor", IBM Tech. Disc. Bul., vol. 19, No. 4, Sep. 1976, pp. 1461-1462.
Brodsky et al., "GaAs Electrically Alterable Read-Only Memory", IBM Tech. Disc. Bul., vol. 25, No. 3A, Aug. 1982, p. 1250.
AIP Conference Proceedings, No. 44, 1978, p. 364, "Superconductor-Semiconductor Device Research by" Silver et al.
J. Appl. Phys. 51(5), May 1980, p. 2736, "Feasibility of Hybrid Josephson Field Effect Transistors," by Clark et al.
Appl. Phys. Lett. 46(1), Jan. 1, 1985, p. 92, "Single-Crystal n-InAs Coupled Josephson Junction", by Kawakami et al.
Physical Review Letters, vol. 54, No. 22, Jun. 3, 1985, p. 2449, "Superconducting Proximity Effect in the Native Inversion Layer on InAs," By Takayanagi et al.
IEDM 85, Dec. 1-4, 1985, Washington, D.C., "Planar-Type InAs-Coupled Three-Terminal Superconducting Devices", by Takayanagi et al.
IEEE Electron Device Letters, vol. EDL-6, No. 6, Jun. 1985, p. 297, "Three-Terminal Superconducting Device Using a Si Single-Crystal Film," by Nishino et al.
IBM Technical Disclosure Bulletin, vol. 19, No. 4, Sep. 1976, p. 1461, "Superconducting Field-Effect Transistor," by Fang et al.
IEEE Electron Device Letters, vol. EDL-1, No. 8, Aug. 1980, p. 154, "Double Heterostructure Ga$_{0.47}$In$_{0.53}$As MESFETs by MBE," by Ohno et al.
Electronics Letters, Nov. 8, 1979, p. 743, "n-Channel Formation on Semi-Insulating InP Surface by M.I.S.-F.E.T.," by Kawakami et al.

Primary Examiner—Edward J. Wojciechowicz
Attorney, Agent, or Firm—Maurice H. Klitzman; T. J. Kilgannon

[57] ABSTRACT

A low band gap semiconductor heterostructure having a surface adaptable to planar processing and all semiconductor properties supported by a fabrication constraint relaxing substrate that does not provide a low impedance parallel current path. A superconductor normal superconductor device of n-InAs-100 nanometers thick with niobium superconductor electrodes spaced 250 nanometers apart and a 100 nanometer gate in the space. The N-InAs is supported by an undoped GaAs layer on a semi-insulating GaAs substrate. A heterojunction field effect transistor device having a GaAlAs gate over a channel 100 nanometers thick on an undoped GaAs layer on a semi-insulating GaAs substrate.

15 Claims, 1 Drawing Sheet

SEMICONDUCTOR HETEROSTRUCTURE ADAPTED FOR LOW TEMPERATURE OPERATION

This is a continuation of application Ser. No. 876,552, filed June 20, 1986, now abandoned.

DESCRIPTION

1. Technical Field

The technical field of the invention is in semiconductor devices particularly suited for low temperature operation where very small signal levels are involved. Compound semiconductors have been found promising in the low temperature field for such advantages as increased mobility, but major disadvantages of such compound semiconductors have been an inherent barrier at an interface with an external metal which is particularly detrimental where small signals are employed and involved structural arrangements because of the short distances and thin structures.

2. Background Art

The compound semiconductor materials that have a small energy gap, particularly InAs and InSb, have the desirable carrier mobility property and have a further advantage that the conduction band energy level is below the Fermi level and thus no barrier is present at an interface with a metal contact.

A generalized survey of low temperature superconductor structures including these materials is reported in the American Institute of Physics Conference Proceedings No. 44, 1978.

The desirability of fabricating Schottky and insulated gate type field effect transistors (IGFET) in InAs and InSb involving superconductivity is reported in J. Appl. Phys. 51 (5), May 1980.

The problems of close electrode spacing in superconductive devices is reported in Appl. Phys. Lett. 46 (1), 1 Jan. 1985, p.92 for n-InAs single crystal material and in Physical Review Letters 54 (22), June 1985, p.2449 for p-InAs material with an inversion layer.

A superconducting single crystal three-terminal device field effect transistor involving an insulated gate positioned on the opposite side of the channel from the source and drain electrodes is reported in IEEE Electron Device Letters, Vol. EDL-6, No. 6, June 1985, p.297.

The use of a heterojunction as the gate of a field effect transistor has been employed in the higher temperature semiconductor art as illustrated in U.S. Pat. No. 4,583,105 but such an application would require dealing with the aggravated effect of barriers at the metal interfaces at low signal levels.

In the prior art, attempts to gain the advantages that the low band gap semiconductors should provide has been accompanied by difficulty in fabricating structures.

DISCLOSURE OF THE INVENTION

The invention is a compound semiconductor heterostructure for low temperature devices compatible with the planar fabrication technology standard in the art.

Figure 1:
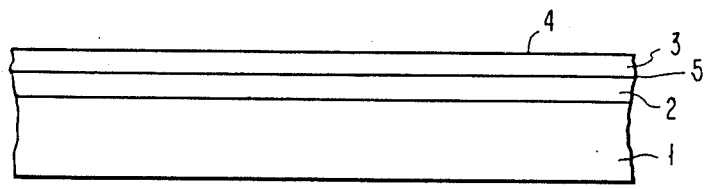
FIG. 1 is an illustration of the compound semiconductor heterostructure of the invention.

Referring to FIG. 1, a substrate 1 is provided having thereon a high resistivity accommodation layer 2 and deposited thereon a layer 3 in which devices may be fabricated of a low band gap compound semiconductor having a lattice constant either the same as or different from that of layer 2. The accommodation layer 2 can conveniently provide the required resistivity by being of a higher band gap undoped semiconductor material.

It is necessary that a parallel current path to the conduction in the layer 3 be prevented. The substrate 1 provides a supporting function and is usually of compensated semiconductor material, known as semi-insulating, with a resistivity of $>10^7$ ohm cm. The accommodation layer 2 insures a high resistance by being undoped of high purity with an impurity density less than $10^{14}$ atoms/cc and is thin, of the order of 1 micron.

The low band gap compound semiconductor materials, such as InAs, InSb and alloys thereof such as GaInAs, have the characteristics that they have the device properties of high carrier mobility and high saturation drift velocity and surface Fermi levels pinned in or near the conduction band.

An advantage of the use of the low band gap semiconductor layer 3 in this invention is a relaxation of the need for single crystal materials. Normally, in large band gap materials such as GaAs, the Fermi level is pinned near mid-gap at grain boundaries causing barriers to carrier flow, however, for low band gap materials, the Fermi level is pinned in or near the conduction band for both surfaces and grain boundaries, providing barrierless carrier flow. In addition, the surface and interface Fermi level pinning that occurs in low band gap materials is small compared to high band gap materials and does not prevent the movement of the Fermi level by doping or gate control means.

The energy levels of these materials are such that with moderate doping control the conduction band can be placed lower than the Fermi level. This operates to eliminate inherent barriers with metal contacts encountered with other types of materials and lastly, being a semiconductor, the materials when used as a channel in a field effect transistor can be constructed such that conduction in the channel can be influenced at a heterojunction with another semiconductor material and an inversion layer can be employed for the channel.

The device layer 3 is compatible with planar type technology on surface 4 and is thin, of the order of 100 nanometers, and a layer of that thickness must be supported. Since there is no significant resistivity as superconducting temperatures are approached, the layer 2 must have high resistivity to prevent an alternate current path to that in the region 3 and for satisfactory semiconductor performance in the region 3, the density of carrier traps must be a minimum.

Figure 2:
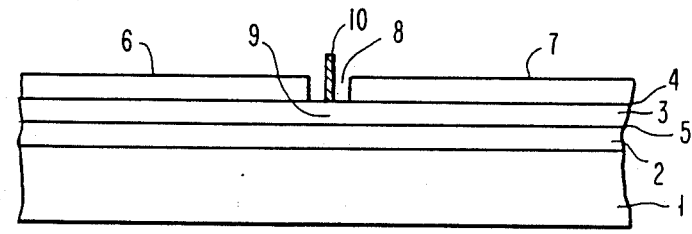
FIG. 2 is an illustration of a superconducting device employing the invention.

Referring next to FIG. 2, the heterostructure of the invention is fabricated in the form of a planar superconductor normal metal superconductor (SNS) weak link type device well known in the superconducting art.

In the device of FIG. 2, superconducting electrical contacts 6 and 7 are applied on the surface 4 of the device layer 3 with a gap which will be the superconducting region. The gap is labelled 8. The superconducting region would be labelled 9, that is the portion of the layer 3 under the gap and a current control gate 10 is shown in the gap region.

The InAs in the layer 3 which is thin provides improved control over the bulk InAs material used in most other devices, not constructed in accordance with applicants' heterostructure. The external superconducting metal contacts 6 and 7 do not form a barrier at the interface with the semiconductor 3 at the interface 4.

Figure 3:
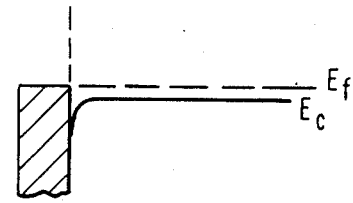
FIG. 3 is a partial band energy diagram illustrating a metal interface with the semiconductor heterostructure of the invention.

Referring to FIG. 3, an illustration of the barrier. Since the conduction band is lower than the Fermi level at the interface, no barrier to carrier flow between the metal and the semiconductor takes place and consequently nearly perfect ohmic contacts are provided. This avoids the deleterious effects to superconducting pair conduction caused by Schottky barrier contacts on other materials.

The devices in the heterostructure of the invention may be readily isolated by merely etching through to the accommodation layer 2. The thickness of the channel 9 is controlled by the selecting of the thickness of the layer 3 and electron mobility in the region 9 is generally higher in low band gap semiconductor material than other materials employing superconducting weak link structures.

Figure 4:
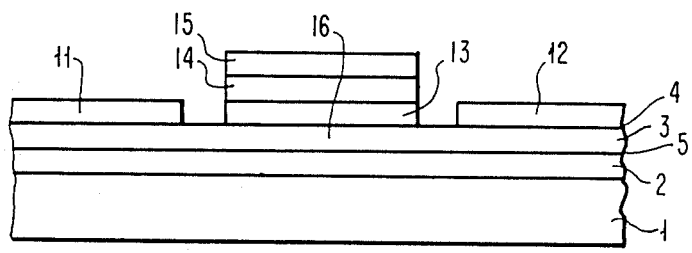
FIG. 4 is an illustration of a low temperature heterojunction field effect transistor employing the invention.

Referring next to FIG. 4, the heterostructure of the invention is employed as a field effect transistor. In the field effect transistor of the invention, the source 11 and drain 12 electrodes are positioned on the surface 4 of the semiconductor layer 3. On the surface of the layer 4, a region of higher band gap semiconductor material 13 is positioned between the source and drain electrodes 11 and 12 to serve as a gate and in order to insure that there is no inherent barrier between the higher band gap semiconductor material 13 and a metal electrode, a region of low band gap semiconductor material in which the conduction band is below the Fermi level 14 is formed on the material 13 and provides a contact as shown in FIG. 3 between a metal 15 and the higher band gap semiconductor 13.

Figure 5:
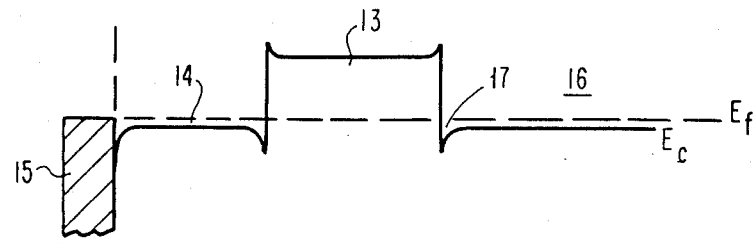
FIG. 5 is a partial band energy diagram illustrating the band energy relationships through the gate electrode of FIG. 4.

Referring next to FIG. 5, the heterostructure of the invention provides a band diagram as illustrated through the gate region in which there is essentially no barrier between the metal 15 and the low band gap semiconductor material 14.

Similarly, at the heterojunction gate, there is a sharp band offset to the material 13 and then another sharp band offset at the interface between the material 13 and the channel 16 which is either a portion of the layer 3 or in the alternative an electron gas in the inversion layer at the interface between the region 13 and 16 which is labelled 17 in the band diagram of FIG. 5.

Figure 6:
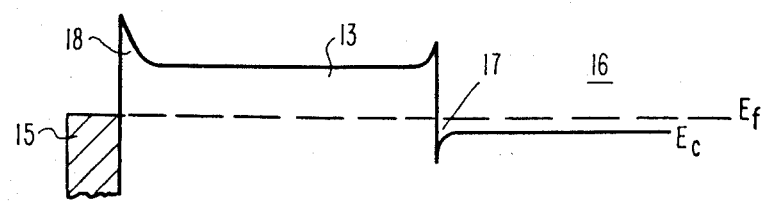
FIG. 6 is a partial band energy diagram showing an alternate gate structure.

Referring to FIG. 6, the use of low band gap material may be replaced by a Schottky barrier 18 serving as contact to the layer 13.

As one illustration, the heterostructure of the invention may have as a substrate 1 GaAs, accommodation layer 2 CdTe and device layer 3 InAs, and as another illustration, the device layer 3 may be InSb and the substrate 1 and accommodation layer 2 are CdTe in a single element.

A principle advantage of the heterostructure of the invention is the providing of a thin web 3 having a surface on which planar type technology for low temperature devices can be practiced and the layer 3 is provided with all the semiconductor advantages, yet any potential parallel current path in the accommodation layer 2 is avoided by the high resistivity of layer 2. Devices made in the layer 3 of the heterostructure of the invention are readily isolated by etching through layer 3.

In accordance with the invention, it should be noted that the low band gap, high band gap, and substrate material described above need not be monocrystalline, lattice matched or epitaxial.

Heretofore in the art, an accommodation layer between a substrate and a device layer was closely lattice matched to the lattice of the device layer but when that is done, there is, at the interface between the layers, a planar high density grid of misfit crystal dislocations.

In accordance with the invention, it has been found that if the material of layer 2 is selected to have a greater than 1.5% lattice difference with respect to the material of the layer 3, the misfit dislocations do not form in a grid at the interface 5 between the layers 2 and 3, but rather epitaxial layers grow so that the misfit dislocations are spread over three dimensions, which in turn produces a $10^7$ reduction in concentration and hence better semiconductor material in the layer 3.

The material InAs in monocrystalline form as layer 3 when epitaxial with undoped high resistivity GaAs with a 7% lattice mismatch exhibits an electron mobility of 5000→6000 cm$^2$/V sec at room temperature and at 4° K.

It will be apparent to one skilled in the art that should properties of the substrate 1 and the material of the layer 3 be such that the >1.5% lattice mismatch and the high resistivity can be satisfied, a separate layer 2 would not be necessary. In practice, however, the layer 1 is usually a plentiful material such as alumina or sapphire and the layer 2 also provides an intermediate lattice accommodation such as would occur with gallium arsenide.

BEST MODE FOR CARRYING OUT THE INVENTION

In the application of the heterostructure of the invention, as a low temperature heterojunction metal semiconductor field effect transistor, referring to FIG. 4, the region 1 would be semi-insulating GaAs having a region 2 of undoped epitaxial GaAs. The region 3 would be n-conductivity type InAs, approximately 100 nanometers thick, doped around $2\times10^{18}$ atoms/cc. The channel length of the region 16 between electrodes 11 and 12 which would serve as the source and drain is of the order of 500 nanometers and the gate of high band gap GaAlAs has a width of the order to 300 nanometers. The device would have a threshold signal of approximately 100 millivolts.

Where the heterostructure of the invention is employed as a superconductive device, as shown in FIG. 2, the region 3 would be of n-type InAs, approximately 100 nanometers thick, doped from $2\times10^{17}$ to $2\times10^{20}$ atoms/cc with silicon. The region 2 would be an undoped 1 micron thick GaAs buffer layer on a semi-insulating GaAs substrate 1. The electrodes 6 and 7 are about 80 nanometers thick niobium which is applied by patterning, employing an e-beam liftoff process, standard in the art. The spacing of the region 8 is of the order of 250 nanometers. A gate 10 is niobium about 100 nanometers.

What has been described is a low band gap semiconductor heterostructure having a surface adaptable to planar processing and all semiconductor properties supported by a fabrication constraint relaxing substrate that does not provide a low impedance parallel current path.

Having thus described our invention, what we claim as new and desire to secure by Letters Patent is:

1. A semiconductor heterostructure comprising:
   a thin planar layer of low band gap compound semiconductor material on the order of 100 nanometers with its fermi level pinned in or near the conduction band with essentially parallel first and second faces having a first face exposed and being supported by a high resistivity member contiguous with said second face, where the low band gap semiconductor material and the high resistivity member are chosen to have a lattice mismatch greater than 1.5% and
   first and second electrical contact means positioned on said exposed face of said low band gap compound semiconductor material separated by a gap.

2. The heterostructure of claim 1 wherein
   said first and second contact means comprise first and second superconductive metal electrodes positioned on said exposed face separated by a gap,
   which further comprises a gate metal member in contact with said exposed face in said gap, wherein,
   said first and second contact means and said gate metal member are disposed on said exposed face to form an FET.

3. The heterostructure of claim 1 wherein
   said first and second contact means comprise source and drain metal electrodes positioned on said exposed face separated by a channel length opening, and
   which further comprises a higher band gap compound semiconductor gate contiguous with said exposed face in said channel length opening and gate contact means to said gate, wherein
   said first and second contact means and said higher band gap compound semiconductor gate disposed on said exposed face to form an FET.

4. The heterostructure of claim 3 where said gate contact means includes a region of low band gap compound semiconductor material positioned between said high band gap compound semiconductor material gate and a contact metal.

5. The heterostructure of claim 3 where said gate contact means is a metal-Schottky barrier external electrode to said higher band gap compound semiconductor material gate.

6. A semiconductor heterostructure comprising a thin low band gap compound semiconductor layer on the order of 100 nanometers with its fermi level pinned in or near the conduction band with an exposed surface supported by a high resistivity contiguous region,
   first and second electrodes positioned on said exposed face of said low band gap compound semiconductor material separated by a gap, and
   a gate control structure in contact with said exposed face in said gap, wherein,
   said first and second electrodes and said gate control structure are disposed on said exposed face to form an FET
   and wherein said low bandgap compound semiconductor material and the material of said high resistivity contiguous region are chosen to have a lattice mismatch greater than 1.5%.

7. The heterostructure of claim 6 where said high resistivity contiguous is a layer of undoped higher band gap compound semiconductor material contriguous with said low band gap compound semiconductor material layer supported by a semi-insulating compound semiconductor material substrate.

8. The heterostructure of claim 7 wherein said low band gap layer is InAs, said undoped high band gap layer is GaAs and said substrate is semi-insulating GaAs.

9. A low temperature heterostructure comprising:
   a thin low band gap compound semiconductor layer on the order of 100 nanometers with its fermi level pinned in or near the conduction band having first and second essentially parallel major surfaces separated by a thickness dimension, a first of said surfaces being exposed,
   an undoped high band gap compound semiconductor layer having first and second essentially parallel major surfaces separated by a thickness dimension, said first surface contiguous with said second surface of said low band gap compound semiconductor, having a lattice mismatch greater than 1.5% with respect to said low band gap semiconductor layer,
   a supporting substrate of semi-insulating compound semiconductor material contiguous with said second surface of said undoped high band gap layer,
   first and second electrodes positioned on said exposed surface of said low band gap compound semiconductor material separated by a gap, and
   a gate control structure in contact with said exposed surface in said gap, wherein,
   said first and second electrodes and said gate control structure are disposed on said exposed surface to form an FET.

10. The heterostructure of claim 9 wherein said low band gap layer and said high band gap layers are monocrystalline.

11. The heterostructure of claim 9 wherein said thickness dimension of said low band gap layer is of the order of 100 nanometers and said thickness dimension of said high band gap layer is 1 micron.

12. The heterostructure of claim 9 wherein said low band gap layer is taken from the group of InAs, InSb and InGaAs and said high band gap layer is taken from the group of GaAs and CdTe.

13. A superconductor heterostructure comprising
   a thin low band gap monocrystalline layer of n-type InAs 100 nanometers thick with its fermi level pinned in or near the conduction band having an exposed surface and supported at the other surface by an epitaxial undoped 1 micron thick layer of GaAs in turn supported by a semi-insulating GaAs substrate,
   first and second 80 nanometers thick niobium ohmic external electrodes on said exposed surface separated by a space of 250 nanometers, and
   a 100 nanometers thick niobium gate contacting said exposed surface in said space, wherein,
   said first and second niobium electrodes and said niobium gate are disposed on said exposed face to form an FET.

14. A low temperature heterojunction field effect transistor comprising:

a low band gap monocrystalline layer of n-type InAs 100 nanometers thick with its fermi level pinned in or near the conduction band having an exposed surface and supported at the other surface by an epitaxial undoped 1 micron thick layer of GaAs in turn supported by a semi-insulating GaAs substrate, source and drain ohmic electrodes on said exposed surface separated by a channel length of 500 nanometers, a 300 nanometers wide heterojunction gate of GaAlAs having first and second essentially planar surfaces, said first surface in contact with said channel and between said source and drain electrodes, and ohmic gate means connected to said second surface of said gate.

15. The field effect transistor of claim 14 where said ohmic contact means to said gate includes a layer of low band gap compound semiconductor material.

* * * * *

UNITED STATES PATENT AND TRADEMARK OFFICE
CERTIFICATE OF CORRECTION

PATENT NO. : 4,860,067

DATED : August 22, 1989

INVENTOR(S) : Thomas N. Jackson et al

It is certified that error appears in the above-identified patent and that said Letters Patent is hereby corrected as shown below:

IN THE CLAIMS:
Col. 6, line 4     After "contiguous" insert --region--.

Signed and Sealed this

Twenty-seventh Day of November, 1990

Attest:

HARRY F. MANBECK, JR.

Attesting Officer     Commissioner of Patents and Trademarks